United States Patent [19]
Satoh

[11] Patent Number: 6,144,087
[45] Date of Patent: Nov. 7, 2000

[54] SEMICONDUCTOR NONVOLATILE STORAGE AND METHOD OF FABRICATING THE SAME

[75] Inventor: Toshihiro Satoh, Tokorozawa, Japan

[73] Assignee: Citizen Watch Co., Ltd., Tokyo, Japan

[21] Appl. No.: 09/035,817

[22] Filed: Mar. 6, 1998

[30] Foreign Application Priority Data

Mar. 7, 1997 [JP] Japan ................................. 9-052862
Jun. 13, 1997 [JP] Japan ................................. 9-156788

[51] Int. Cl.$^7$ ............................. H01L 33/00; H01L 29/78
[52] U.S. Cl. ............................................................ 257/530
[58] Field of Search ........................................... 257/530

[56] References Cited

U.S. PATENT DOCUMENTS 5,550,404 8/1996 Yen et al. .

FOREIGN PATENT DOCUMENTS 08288468 11/1996 Japan .

*Primary Examiner*—Stephen D. Meier
*Attorney, Agent, or Firm*—Armstrong, Westerman, Hattori, McLeland and Naughton

[57] ABSTRACT

A semiconductor nonvolatile storage that is an inter-gate insulating film breakdown type memory is configured by providing a field oxide film on a semiconductor substrate 1, a gate electrode on the field oxide film and a mask oxide film on the surface of the gate electrode, forming an opening in the mask oxide film and forming a memory oxide film on the gate electrode exposed thereat, providing a memory gate electrode of a size extending from over the memory oxide film to over the mask oxide film, and making the thickness of the memory oxide film thinner than the thickness of the mask oxide film.

2 Claims, 15 Drawing Sheets

SEMICONDUCTOR NONVOLATILE STORAGE AND METHOD OF FABRICATING THE SAME

BACKGROUND OF THE INVENTION

1. Field of the Invention

This invention relates to a semiconductor nonvolatile storage (device) and a method of fabricating the same, particularly to a semiconductor nonvolatile storage writable only once by breakdown of a memory oxide film provided between a gate electrode and a memory gate electrode and a method of fabricating the same.

2. Description of the Related Art

In semiconductor integrated circuits, product yield and performance stability are improved by storing in a once-only writable memory device correction for variance in transistor threshold voltage during production, change in operating conditions or the like.

This type of memory device is also utilized, for example, in a frequency error compensation circuit used in an oscillator circuit which generates a constant frequency signal.

Such once-only writable memory devices include PROMs (Programmable Read Only Memories) of, among others, the laser fusing, electrical fusing and junction breakdown types.

The laser fusing PROM is high in cost because it needs a laser beam source for the data write operation and requires a window for entry of the laser beam to be formed in the passivation film (protective film) covering the fuse. Another disadvantage is low mounting freedom owing to the need to conduct writing after mounting.

The electrical fusing PROM involves physical breakdown of polysilicon and therefore entails problems such as silicon fragment occurrence and passivation film degradation.

The junction breakdown PROM uses a current of at least 100 mA for the data write operation. Since this requires application of a high voltage that the semiconductor device must be capable of withstanding, the production process is complex and connection to other devices is not possible.

To overcome these problems, Japanese patent laid-open publication No. 8-288468, for example, teaches a nonvolatile semiconductor device wherein silicon fragment contamination and passivation film degradation do not occur, increased breakdown voltage is not required, and a once-only write is also possible after mounting.

This nonvolatile semiconductor device is configured to enable a once-only write by breaking down a memory oxide film provided between a gate electrode and a memory gate electrode provided on a field oxide film on the semiconductor substrate.

In the fabrication of this type of semiconductor device, the trend toward thinner gate oxide films, memory oxide films and the like make securement of dry etching conditions having a sufficient selectivity ratio with respect to the oxide film an important issue where the purpose is damage-free processing of the gate electrodes.

As an effective means for securing a sufficient selectivity ratio with respect to the oxide film in the processing of gate electrodes, dry etching using hydrogen bromide (HBr) as etching gas is widely adopted.

In dry etching using hydrogen bromide as etching gas, however, since bromide occurring during etching on the wafer surface remains as a residual reaction product, treatment with a hydrofluoric acid (HF) aqueous solution is necessary for its removal.

Therefore, at the time of fabricating a semiconductor nonvolatile storage wherein writing is effected by breaking down a thin memory oxide film formed between a gate electrode and a memory gate electrode, whose material is polycrystalline silicon, (hereinafter also called an "inter-gate insulating film breakdown type memory"), the hydrofluoric acid aqueous solution treatment causes etching of the memory oxide film in the lateral direction simultaneously with its exposure.

As a result, unnecessary current flows between the gate electrode and the memory gate electrode, possibly making normal operation as a semiconductor nonvolatile storage unattainable.

The method of fabricating an inter-gate insulating film breakdown type memory that is a semiconductor nonvolatile storage of this type according to the prior art will now be explained with reference to FIGS. 21 to 29.

FIGS. 21 to 29 are sectional views showing in order the steps of the conventional method of fabricating an inter-gate insulating film breakdown type memory.

First, as shown in FIG. 21, a field oxide film 2 is formed on the surface of a semiconductor substrate 1 of N-type conductivity.

Next, as shown in FIG. 22, the surface of the semiconductor substrate 1 formed with the field oxide film 2 is formed throughout with a first polycrystalline silicon film 3a of prescribed thickness by the chemical vapor deposition (CVD) process.

The surface of the first polycrystalline silicon film 3a is then added throughout with phosphorus, an impurity of N-type conductivity, by the ion implantation method to form a first polycrystalline silicon film 3a added with N-type impurity.

Next, annealing is effected in an oxygen atmosphere using an oxidation-diffusion furnace to form a memory oxide film 4 on the surface of the first polycrystalline silicon film 3a added with N-type impurity, as shown in FIG. 23.

Thereafter, as shown in FIG. 24, the surface of the memory oxide film 4 formed on the semiconductor substrate 1 is formed throughout with a second polycrystalline silicon film 3b of prescribed thickness by the CVD process.

The surface of the second polycrystalline silicon film 3b is added throughout with phosphorus, an impurity of N-type conductivity, by the ion implantation method to form a second polycrystalline silicon film 3b added with N-type impurity.

Next, the surface of the second polycrystalline silicon film 3b is spin-coated throughout with photoresist. The photoresist is exposed using a prescribed photomask and developed to pattern the photoresist 5 in the shape of a memory gate electrode 6, as shown in FIG. 25.

Dry etching using hydrogen bromide as etching gas is effected using the patterned photoresist 5 as an etching mask to pattern the second polycrystalline silicon film 3b shown in FIG. 24 into the memory gate electrode 6 shown in FIG. 25.

The semiconductor substrate 1 is thereafter immersed in a hydrofluoric acid aqueous solution to remove bromide occurring as a reaction product of the hydrogen bromide. The photoresist 5 is then removed.

Next, the surfaces of the first polycrystalline silicon film 3a and the memory gate electrode 6 are spin-coated throughout with photoresist. The photoresist is exposed using a prescribed photomask and developed to pattern the photoresist 5 in the shape of a gate electrode 7, as shown in FIG. 26.

Dry etching using hydrogen bromide as etching gas is effected using the patterned photoresist 5 as an etching mask to pattern the first polycrystalline silicon 3a as the gate electrode 7.

The semiconductor substrate 1 is thereafter immersed in a hydrofluoric acid aqueous solution to remove bromide occurring as a reaction product of the hydrogen bromide. The photoresist 5 is then removed.

Next, annealing is effected in an oxygen atmosphere using an oxidation diffusion furnace to form a memory mask oxide film 8 on the surfaces of the memory gate electrode 6 and the gate electrode 7, as shown in FIG. 27.

Following this, a silicon oxide film-type interlevel insulator 9 is formed over the whole surface by the CVD process so as to cover the memory mask oxide film 8.

The surface is spin-coated throughout with photoresist. The photoresist is exposed using a prescribed photomask and developed to pattern the photoresist 5 to form openings therein at locations where contact holes are to be formed, as shown in FIG. 28.

Isotropic etching is thereafter effected to pattern the interlevel insulator 9 at prescribed points (locations opposite the memory gate electrode 6 and the gate electrode 7), thereby forming contact holes 10.

Then, as shown in FIG. 29, metallic interconnections 11 composed of aluminum are formed through the contact holes 10 to complete an N-type inter-gate insulating film breakdown type memory.

Thus, as shown in FIG. 29, the conventional inter-gate insulating film breakdown type memory has the field oxide film 2 provided on the semiconductor substrate 1 and the gate electrode 7 provided on the field oxide film 2.

Further, the memory oxide film 4 is provided between the surface of the gate electrode 7 and the memory gate electrode 6 in the same region as the memory gate electrode 6.

A program can be written to this inter-gate insulating film breakdown type memory one time only by applying voltage to the memory gate electrode 6 to break down the memory oxide film 4.

Although the structure and method of fabricating an insulating film breakdown type memory whose gate electrode and memory gate electrode are of N-type conductivity (an N-type inter-gate insulating film breakdown type memory) was explained, the structure and fabrication of an insulating film breakdown type memory whose gate electrode and memory gate electrode are of P-type conductivity (a P-type inter-gate insulating film breakdown type memory) are substantially the same.

The change in current flow between the gate electrode 7 and the memory gate electrode 6 with voltage applied to the memory gate electrode 6 in the conventional inter-gate insulating film breakdown type memory of this type is shown by the graph of FIG. 31.

In FIG. 31, the horizontal axis represents voltage applied to the memory gate electrode 6 and the vertical axis represents current flow between the gate electrode 7 and the memory gate electrode 6. The broken line 13 indicates the breakdown voltage of the memory oxide film 4 and the one-dot chain line 14 indicates level of leak current allowable from the aspect of reliability.

Whether or not an inter-gate insulating film breakdown type memory of the type to which this invention relates has been programmed is judged from the value of the current between the gate electrode 7 and the memory gate electrode 6 relative to the voltage applied to the memory gate electrode 6.

The level of leak current allowable from the aspect of reliability referred to here indicates a level which does not result in an unprogrammed inter-gate insulating film breakdown type memory being judged as being programmed when a voltage lower than the programming voltage is applied to the memory gate electrode 6 for judging programmed/unprogrammed state.

As indicated by the characteristic of FIG. 31, in an inter-gate insulating film breakdown type memory fabricated by the conventional method explained with reference to FIGS. 21 to 29, the leak current exceeds the level allowable from the aspect of reliability at a low level of the voltage applied to the memory gate electrode 6 of around 2.5 V.

An investigation of the cause for this revealed the following fact. For explaining this, an enlarged sectional view is shown in FIG. 30 of the boundary portion between the gate electrode 7 and the end portion of the memory gate electrode 6, the memory gate electrode 6 being that immediately after processing of the second polycrystalline silicon film 3b.

To secure a sufficient selectivity ratio with respect to the oxide film in the process of fabricating such an inter-gate insulating film breakdown type memory, dry etching of the memory gate electrode and the gate electrode is effected using hydrogen bromide (HBr) as the etching gas. Removal of the resulting bromide, produced as a reaction product, requires treatment with a hydrofluoric acid aqueous solution.

Because of this, as shown in FIG. 30, the thin memory oxide film 4 formed between the gate electrode 7 and the memory gate electrode 6, whose material is polycrystalline silicon, is etched laterally by the hydrofluoric, acid aqueous solution, as indicated by the arrow E, simultaneously with its exposure.

The region where the memory oxide film 4 is laterally etched in this way is thereafter hard to form with a silicon oxide film possessing sufficient electrical insulating property either in the step shown in FIG. 27 of forming the memory mask oxide film 8 in an oxygen atmosphere using an oxidation diffusion furnace or in the step of forming the interlevel insulator 9 by the CVD process. In the worst case it remains as a cavity region.

Since this cavity region is present between the gate electrode 7 and the memory gate electrode 6 as a gap of only about several nm, it has poorer electrical insulating property than the region of the memory oxide film 4. As a result, unnecessary current flows between the gate electrode 7 and the memory gate electrode 6 merely by the application of a small voltage to the memory gate electrode 6, making normal operation as an inter-gate insulating film breakdown type memory extremely difficult to control.

SUMMARY OF THE INVENTION

An object of this invention is to overcome the foregoing problems by, in a semiconductor nonvolatile storage constituting an inter-gate insulating film breakdown type memory as described in the foregoing, providing a structure that ensures constant normal operation by suppressing flow of unnecessary current between the gate electrode and the memory gate electrode, and a method of fabricating the semiconductor nonvolatile storage.

To achieve this object, the semiconductor nonvolatile storage according to this invention is configured as follows.

It comprises a field oxide film provided on a semiconductor substrate, a gate electrode provided on the field oxide film, a mask oxide film provided on a surface of the gate electrode, a memory oxide film provided on the gate electrode via an opening formed in the mask oxide film, and a memory gate electrode provided to extend from over the memory oxide film to over the mask oxide film, a thickness of the memory oxide film being made thinner than a thickness of the mask oxide film.

A memory mask oxide film can be provided on surfaces of the memory gate electrode and the gate electrode and an interlevel insulator of doped silicon oxide film type be provided to cover the memory mask oxide film.

A method of fabricating the semiconductor nonvolatile storage according to the invention includes the following steps of:

forming a field oxide film on a semiconductor substrate,
forming a first polycrystalline silicon film on the field oxide film,
forming a mask oxide film on the first polycrystalline silicon film,
forming an opening in the mask oxide film at a region of the memory oxide film and forming on the first polycrystalline silicon film within the opening a memory oxide film of thinner thickness than the mask oxide film,
forming a second polycrystalline silicon film over the whole surface,
forming a memory gate electrode by processing the second polycrystalline silicon film to a prescribed size extending over the memory oxide film and the mask oxide film thereabout by dry etching using hydrogen bromide as etching gas,
removing bromide occurring as a reaction product of the hydrogen bromide by thereafter immersing the semiconductor substrate in a hydrofluoric acid aqueous solution, and
forming a gate electrode by etching the first polycrystalline silicon film.

A method of fabricating the semiconductor nonvolatile storage according to the invention can instead include the following steps of:

forming a field oxide film on a semiconductor substrate,
forming a first polycrystalline silicon film on the field oxide film,
forming a gate electrode by etching the first polycrystalline silicon film,
forming a mask oxide film on a surface of the gate electrode,
forming an opening in the mask oxide film at a region of the memory oxide film and forming on the gate electrode within the opening a memory oxide film of thinner thickness than the mask oxide film,
forming a second polycrystalline silicon film over the whole surface,
forming a memory gate electrode by processing the second polycrystalline silicon film to a prescribed size extending over the memory oxide film and the mask oxide film thereabout by dry etching using hydrogen bromide as etching gas, and
removing bromide occurring as a reaction product of the hydrogen bromide by thereafter immersing the semiconductor substrate in a hydrofluoric acid aqueous solution.

In these methods of fabricating a semiconductor nonvolatile storage, the step of forming a gate electrode can be followed by effecting the steps of:

forming a memory mask oxide film on a surface of the memory gate electrode and the gate electrode, and
forming an interlevel insulator of doped silicon oxide film type to cover the memory mask oxide film.

The above and other objects, features and advantages of the invention will be apparent from the following detailed description which is to be read in conjunction with the accompanying drawings.

BRIEF DESCRIPTION OF THE DRAWINGS

FIG. 11 shows the completed state of the semiconductor nonvolatile storage.

FIG. 29 shows the completed state of the semiconductor nonvolatile storage.

DETAILED DESCRIPTION OF THE PREFERRED EMBODIMENTS

The structure of a semiconductor nonvolatile storage and methods of fabricating the same that are preferred embodiments for implementing this invention will now be explained with reference to the drawings.

The following explanation of embodiments of the invention will be made with respect to a semiconductor nonvolatile storage constituted as an N-type inter-gate insulating film breakdown type memory.

Figure 11:
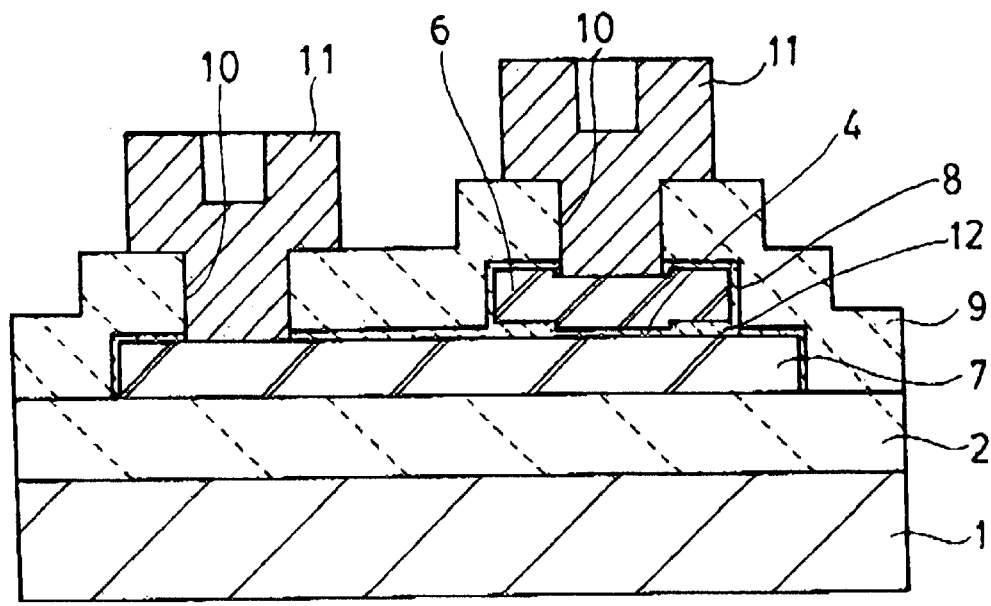
Figure 12:
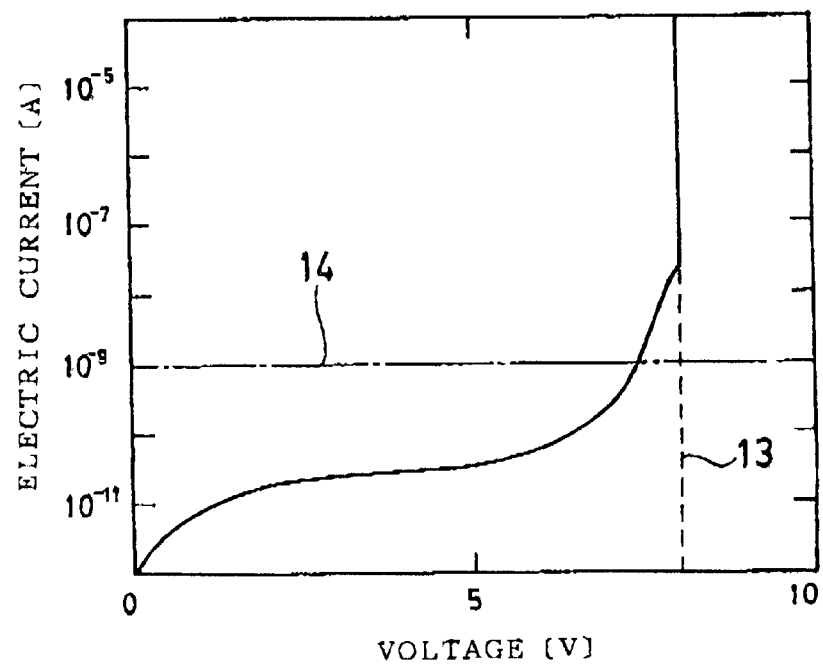
FIG. 12 is a graph showing how current flow between the gate electrode and the memory gate electrode is related to the voltage applied to the memory gate electrode in the semiconductor nonvolatile storage according to the invention.

Structure and characteristic of the semiconductor nonvolatile storage according to this invention: FIGS. 11 and 12

The structure of the semiconductor nonvolatile storage according to this invention will be explained first with reference to FIG. 11.

As shown in FIG. 11, the semiconductor nonvolatile storage according to this invention has a field oxide film 2 provided on a semiconductor substrate 1 and a gate electrode 7 provided on the field oxide film 2. In addition, a mask oxide film 12 is provided on the surface of the gate electrode 7, and a memory oxide film 4 of thinner thickness than the mask oxide film 12 is provided on the gate electrode via an opening formed in the mask oxide film 12.

A memory gate electrode 6 is provided on the memory oxide film 4 to be larger than the memory oxide film 4 and extend to over the mask oxide film 12.

Moreover, in this embodiment a memory mask oxide film 8 is provided on the surfaces of the memory gate electrode 6 and the gate electrode 7 and an interlevel insulator 9 of doped silicon oxide film type is provided to cover the memory mask oxide film 8.

Contact holes 10 are formed prescribed locations of the interlevel insulator 9 opposite the memory gate electrode and the gate electrode 7, and metallic interconnections 11 are formed through the contact holes 10 to establish electrical continuity with the memory gate electrode and the gate electrode 7.

The semiconductor nonvolatile storage according to this invention thus is formed around the memory oxide film 4 of thin thickness with the mask oxide film 12 of thicker thickness. When the memory gate electrode 6 is formed by etching the polycrystalline silicon film, therefore, the memory oxide film 4 is not etched laterally even when dry etching using hydrogen bromide (HBr) as etching gas is effected and treatment with a hydrofluoric acid aqueous solution is thereafter effected to remove bromide occurring as a reaction product.

Even if the periphery of the mask oxide film 12 is etched laterally by the treatment with hydrofluoric acid aqueous solution, it gets by with only slight etching thanks to its large thickness and, in the subsequent step of forming the memory mask oxide film 8, the memory mask oxide film 8 consisting of a silicon oxide film having good electrical insulating property is also formed at the etched portion.

Even if a portion of the cavity region remains, no failure to achieve normal operation of the semiconductor nonvolatile storage occurs owing to current flow between the gate electrode 7 and the memory gate electrode 6 because insulating property can be secured owing to the considerably greater distance therebetween at this portion than at the region of the memory oxide film 4.

A characteristic typical of an N-type inter-gate insulating film breakdown type memory, which is a semiconductor nonvolatile storage according to the invention, is shown in FIG. 12.

Figure 31:
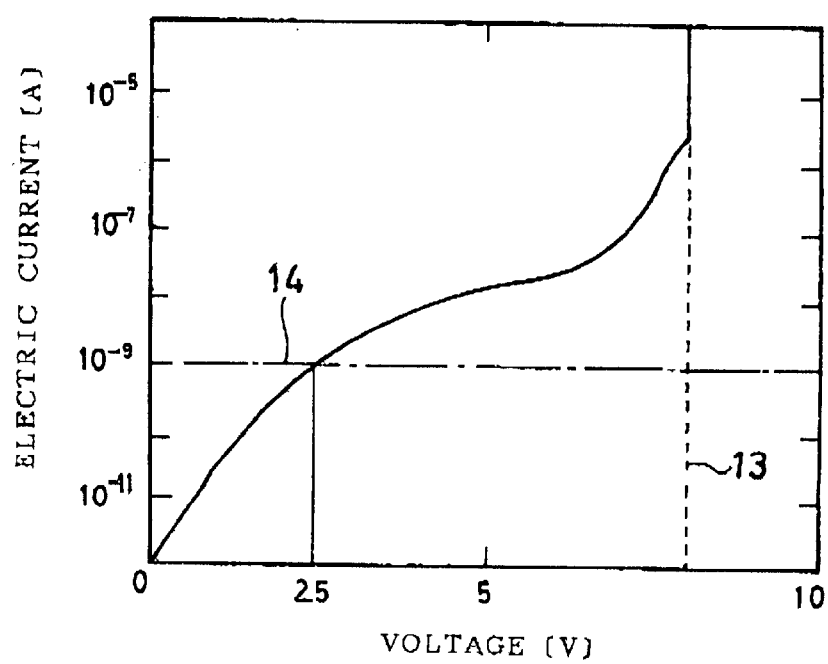
FIG. 31 is a graph showing how current flow between the gate electrode and the memory gate electrode is related to the voltage applied to the memory gate electrode in the semiconductor nonvolatile storage according to the prior art.

FIG. 12 is a graph, similar to that of FIG. 31, relating to the N-type inter-gate insulating film breakdown type memory of FIG. 11, showing the results measured to evaluate current flow between the memory gate electrode 6 and the gate electrode 7 relative to voltage applied to the memory gate electrode 6.

The horizontal axis represents voltage applied to the memory gate electrode 6 and the vertical axis represents current flow between the gate electrode 7 and the memory gate electrode 6. The broken line 13 indicates the breakdown voltage of the memory oxide film 4 and the one-dot chain line 14 indicates level of leak current allowable from the aspect of reliability.

As can be appreciated from FIG. 12, in the N-type inter-gate insulating film breakdown type memory according to this embodiment, the leak current does not exceed the level allowable from the aspect of reliability at a low level of the voltage applied to the memory gate electrode 6 and, in fact, does not exceed it until a voltage quite close to the breakdown voltage of the memory oxide film 4 is applied thereto.

This is because in the semiconductor nonvolatile storage of this invention the memory oxide film 4 is surrounded by the thick mask oxide film 12 and is therefore safe from exposure during formation of the memory gate electrode even if the dry etching with hydrogen bromide is followed by treatment with hydrofluoric acid aqueous solution for removal of the bromide that occurs as a reaction product of the etching and remains on the wafer surface.

By this, constant normal operation can be ensured because the leak current, which, as shown regarding an N-type inter-gate insulating film breakdown type memory in FIG. 31, has heretofore occurred at a low level of the voltage applied to the memory gate electrode 6, is greatly ameliorated to a level allowable from the aspect of reliability, as shown in FIG. 12.

The case of an N-type inter-gate insulating film breakdown type memory has been explained. In the case of a P-type inter-gate insulating film breakdown type memory, the structure is the same in all aspects as that of the N-type inter-gate insulating film breakdown type memory described above, with the sole exception that a gate electrode and a memory gate electrode of P-type conductivity are provided. The conductivity of the semiconductor substrate 1 can be either N-type or P-type.

Depending on the application, the memory mask oxide film 8 and the interlevel insulator 9 can be omitted.

First fabrication method: FIGS. 1 to 11, 21 and 22

A method of fabricating the semiconductor nonvolatile storage explained with reference to FIG. 11 that is a first embodiment of the invention method will now be explained with reference to the sectional views of FIGS. 1 to 11, 21 and 22.

FIGS. 1 to 11 are schematic sectional views that illustrate a first embodiment of the method of fabricating a semiconductor nonvolatile storage and show the steps differing from those of the prior art in order. Although FIGS. 21 and 22 are schematic sectional views showing initial steps of a conventional fabrication method, they will be referred to again because they also apply in the fabrication method of this embodiment.

Figure 21:
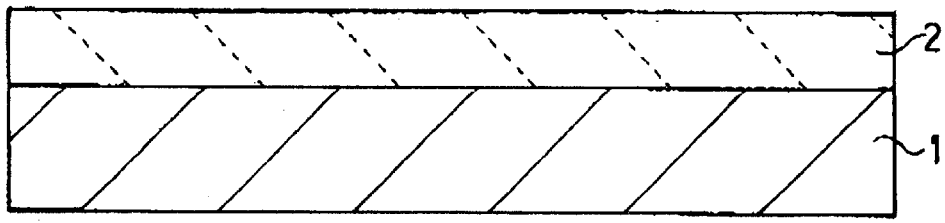
FIGS. 21 to 29 are schematic sectional views for explaining a conventional method of fabricating a semiconductor nonvolatile storage, wherein the steps are illustrated in order
Figure 22:
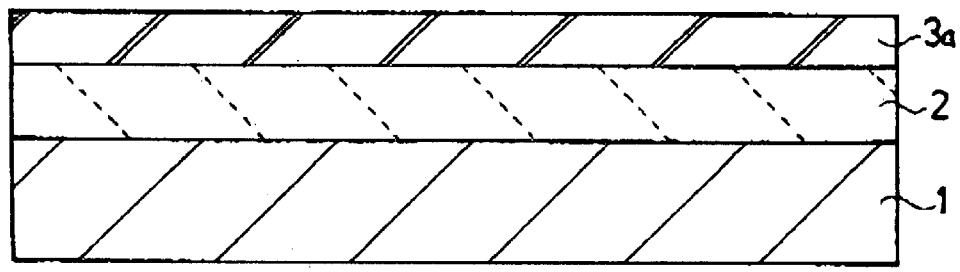
Figure 23:
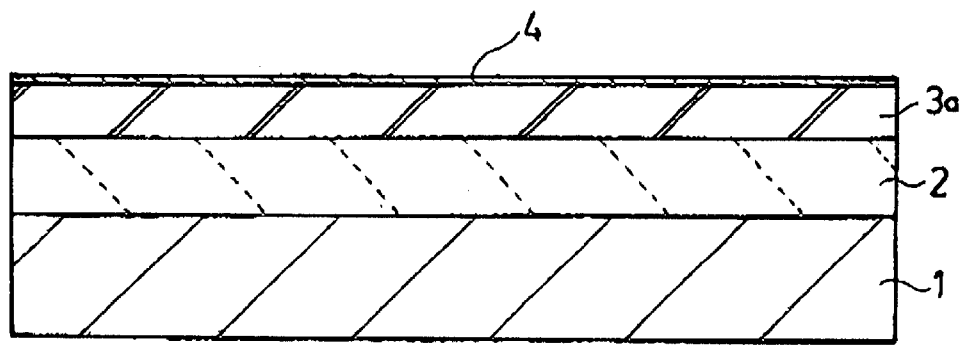
Figure 24:
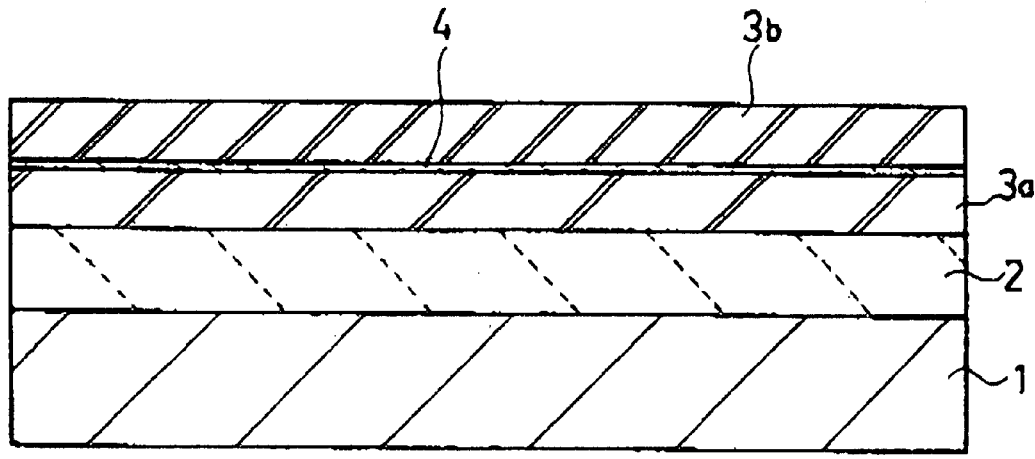
Figure 25:
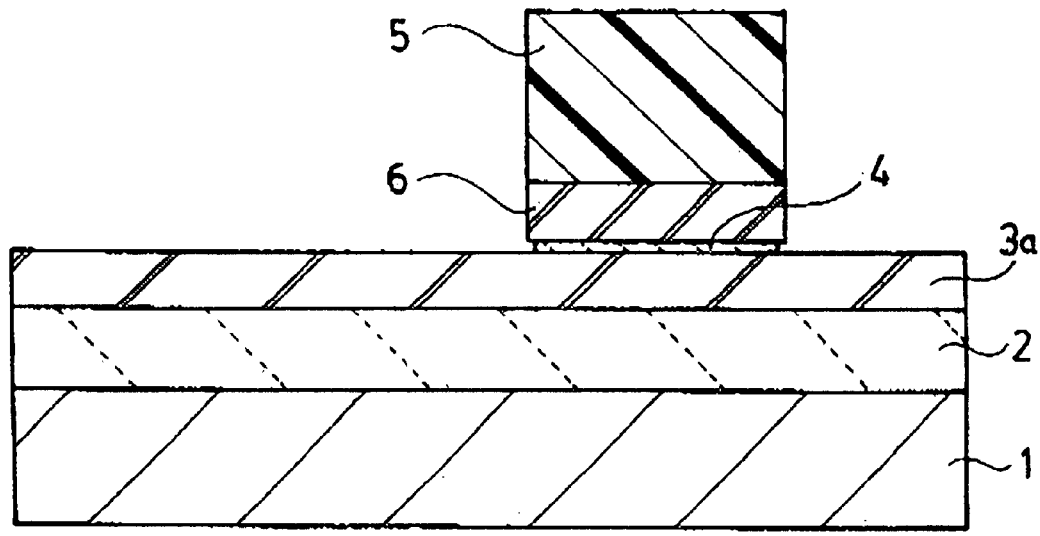
Figure 26:
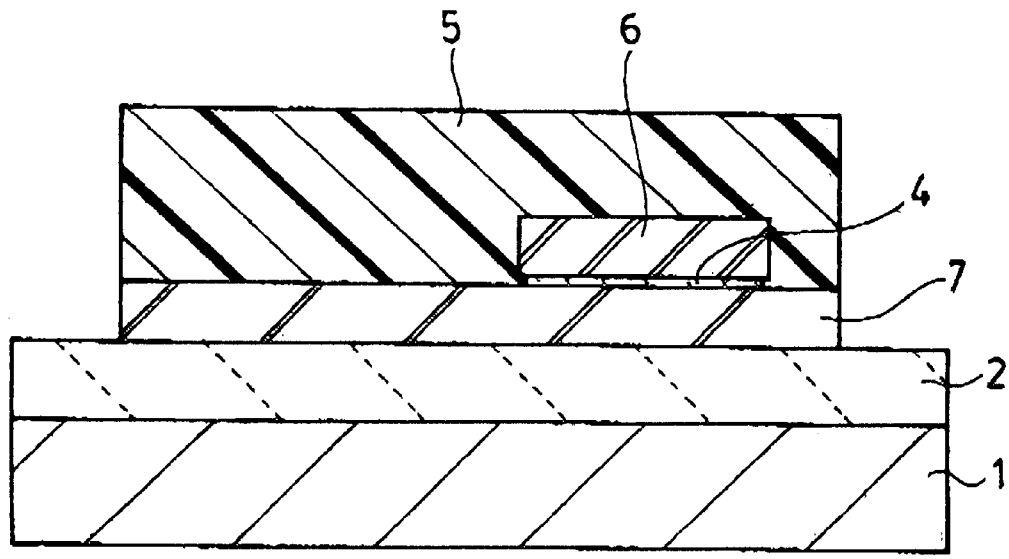
Figure 27:
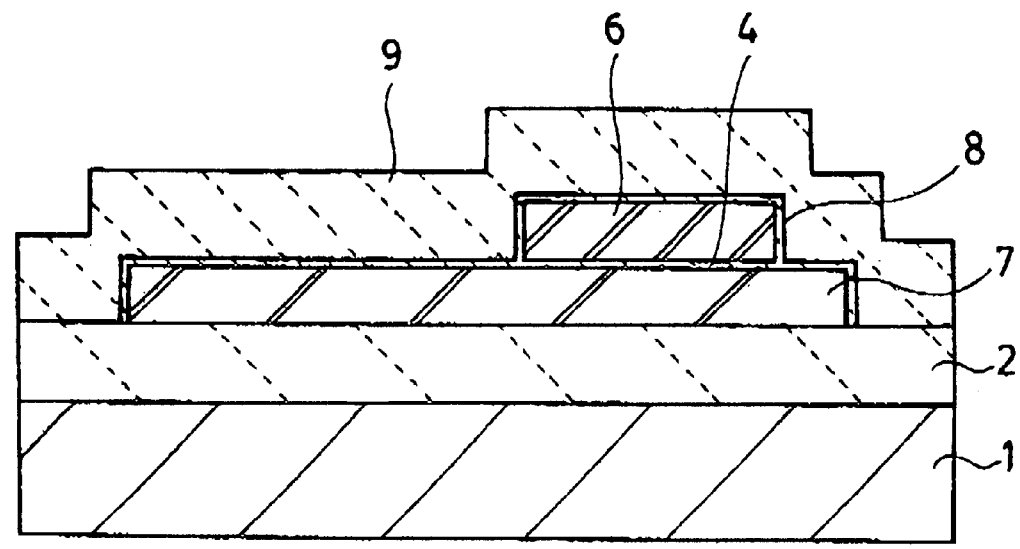
Figure 28:
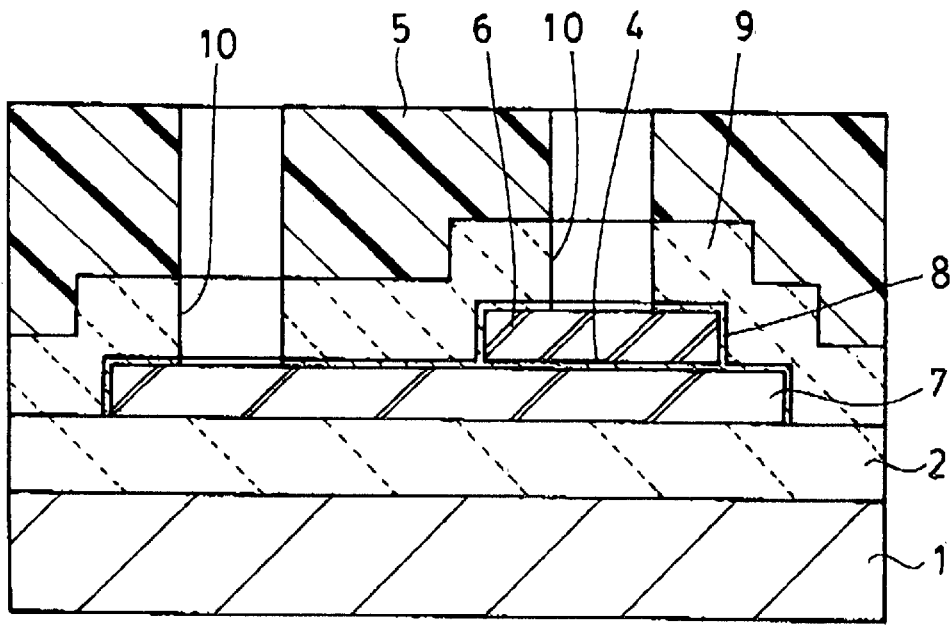
Figure 29:
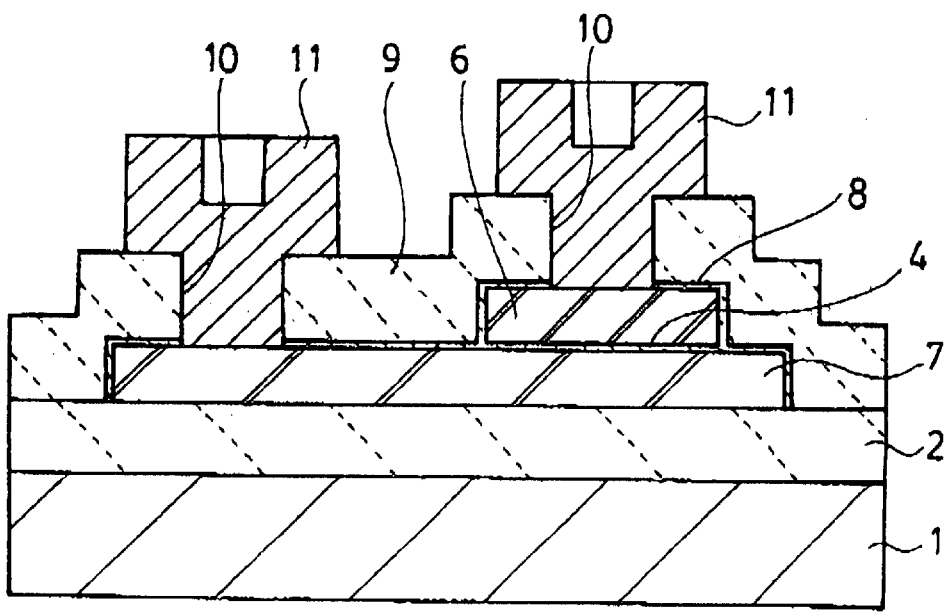
Figure 30:
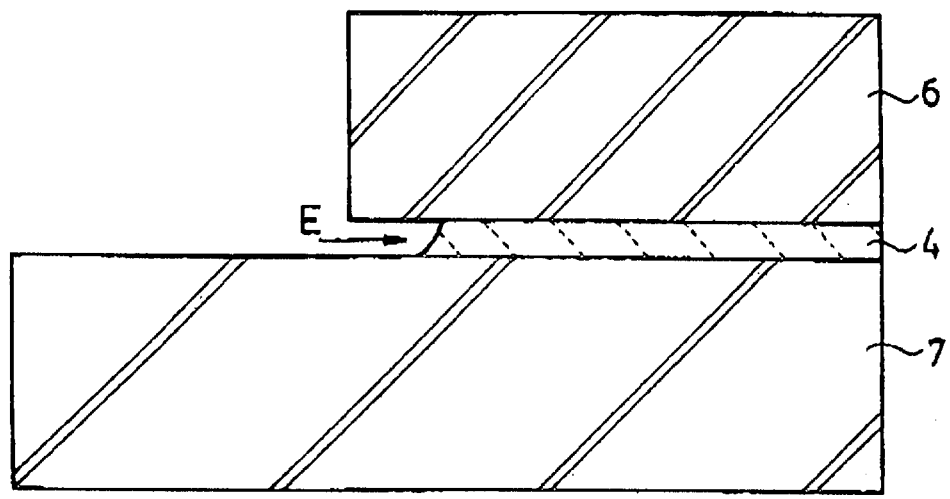
FIG. 30 is an enlarged sectional view of an essential portion for explaining a problem point of the conventional fabricating method.

At the start of this fabrication method, in the conventional manner, as shown in FIG. 21, a field oxide film 2 is formed on the surface of a semiconductor substrate 1 of N-type conductivity to a thickness of 550 nm in a 1000° C. oxygen atmosphere using an oxidation diffusion furnace, Next, as shown in FIG. 22, the surface of the field oxide film 2 is formed with a first polycrystalline silicon film 3a to a thickness of 350 nm by the CVD process using monosilane ($SiH_4$) as reaction gas.

The surface of the first polycrystalline silicon film 3a is then added throughout with phosphorus, an impurity of N-type conductivity, by the ion implantation method under condition of an ion implantation dose of about $10^{16}$ atoms/$cm^2$, thereby forming a first polycrystalline silicon film 3a added with N-type impurity.

Figure 1:
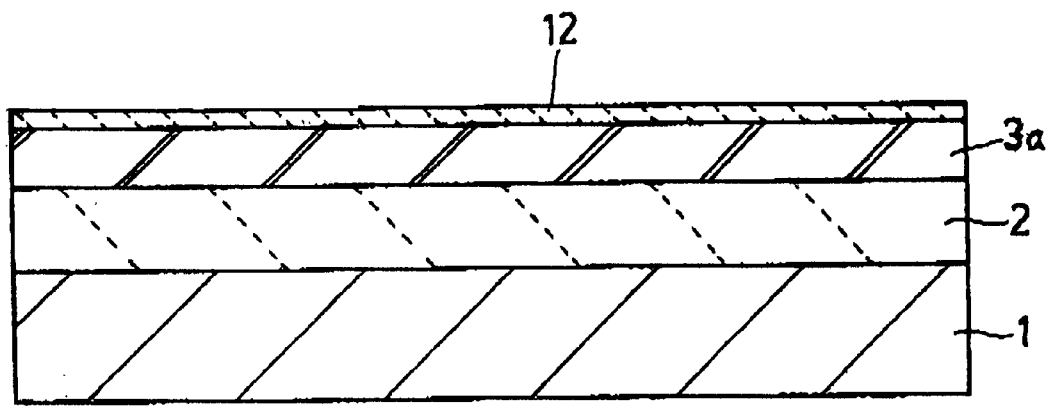
FIGS. 1 to 11 are schematic sectional views for explaining a first embodiment of the method of fabricating a semiconductor nonvolatile storage according to the invention, wherein steps differing from those of the prior art are illustrated in order

Following this, as shown in FIG. 1, annealing is effected in an oxygen atmosphere at 900° C. using an oxidation diffusion furnace to form a mask oxide film 12 on the surface of the first polycrystalline silicon film 3a to a thickness of 10 nm.

Figure 2:
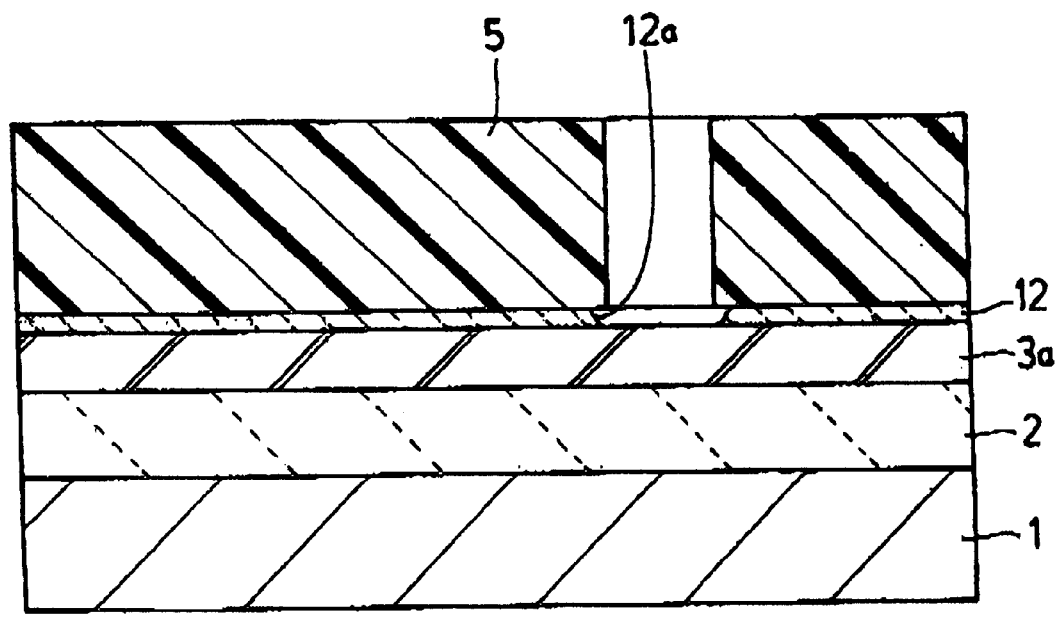

The surface of the first polycrystalline silicon film 3a is then spin-coated throughout with photoresist. The photoresist is exposed using a prescribed photomask and developed to pattern the photoresist 5 to form an opening therein at a region to be formed with a memory oxide film, as shown in FIG. 2.

The semiconductor substrate 1 is thereafter immersed in a hydrofluoric acid aqueous solution to form an opening 12a by removing the mask oxide film 12 present at the region to be formed with the memory oxide film, using the patterned photoresist 5 as an etching mask. The photoresist 5 is then removed.

Figure 3:
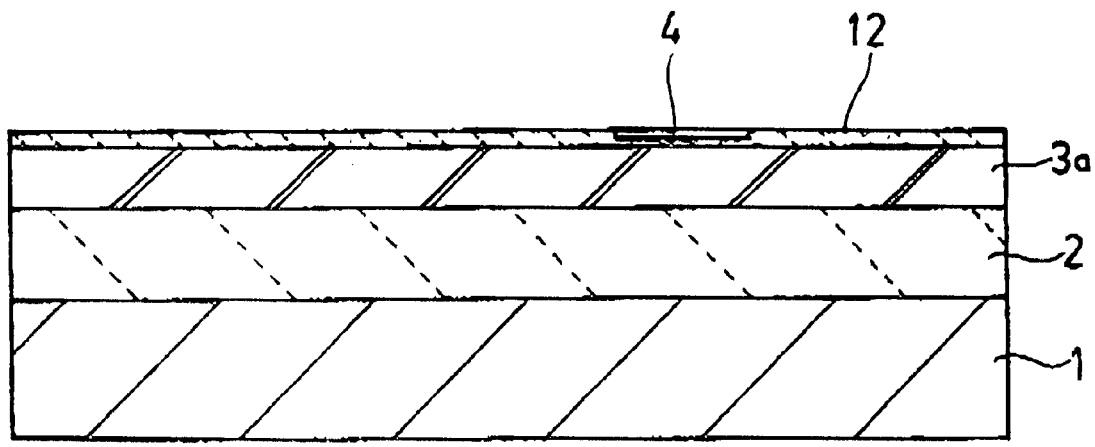

Next, annealing is effected in an oxygen atmosphere at 900° C. using an oxidation diffusion furnace to form a memory oxide film 4 of 3 nm thickness on the surface of the first polycrystalline silicon film 3a exposed at the opening 12a of the mask oxide film 12, as shown in FIG. 3.

Figure 4:
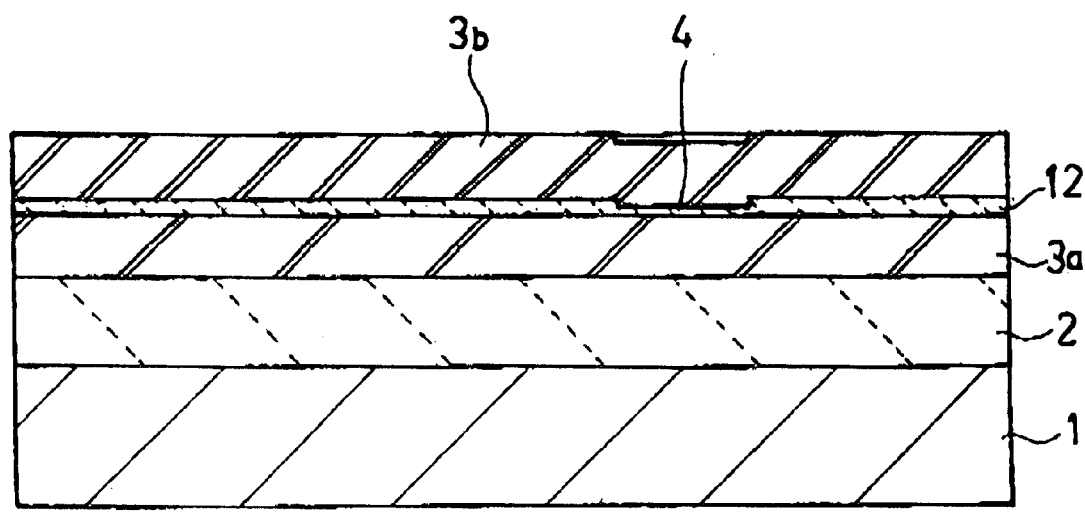

Thereafter, as shown in FIG. 4, the surfaces of the mask oxide film 12 and the memory oxide film 4 are formed throughout with a second polycrystalline silicon film 3b of 350 nm thickness by the CVD process using monosilane ($SiH_4$) as reaction gas.

The surface of the second polycrystalline silicon film 3b is added throughout with phosphorus, an impurity of N-type conductivity, by the ion implantation method under condition of an ion implantation dose of about $10^{16}$ atoms/cm$^2$, thereby forming a second polycrystalline silicon film 3b added with N-type impurity.

Figure 5:
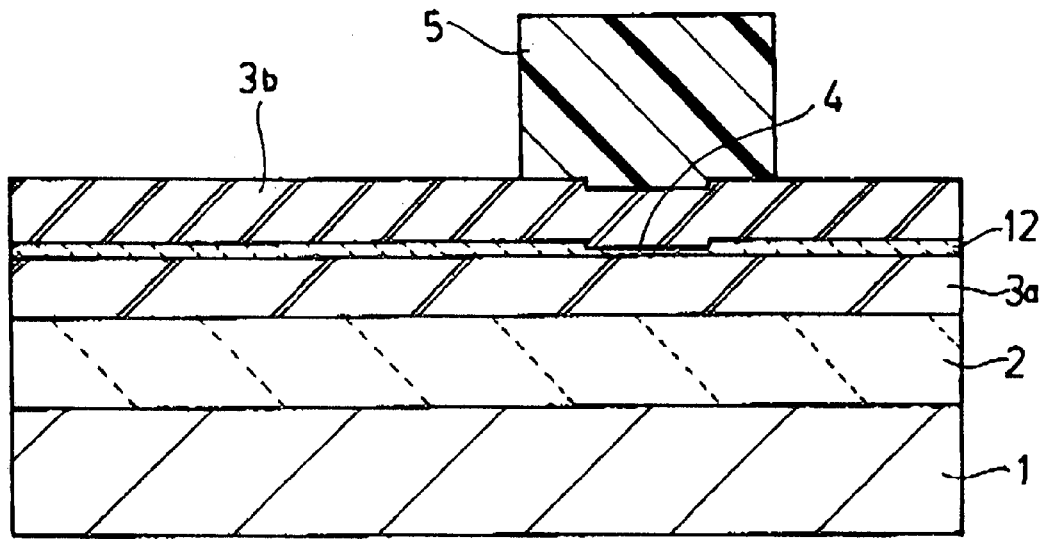

Next, the surface of the second polycrystalline silicon film 3b is spin-coated throughout with photoresist. The photoresist is exposed using a prescribed photomask and developed to pattern the photoresist 5 in the shape of a memory gate electrode, as shown in FIG. 5.

Figure 6:
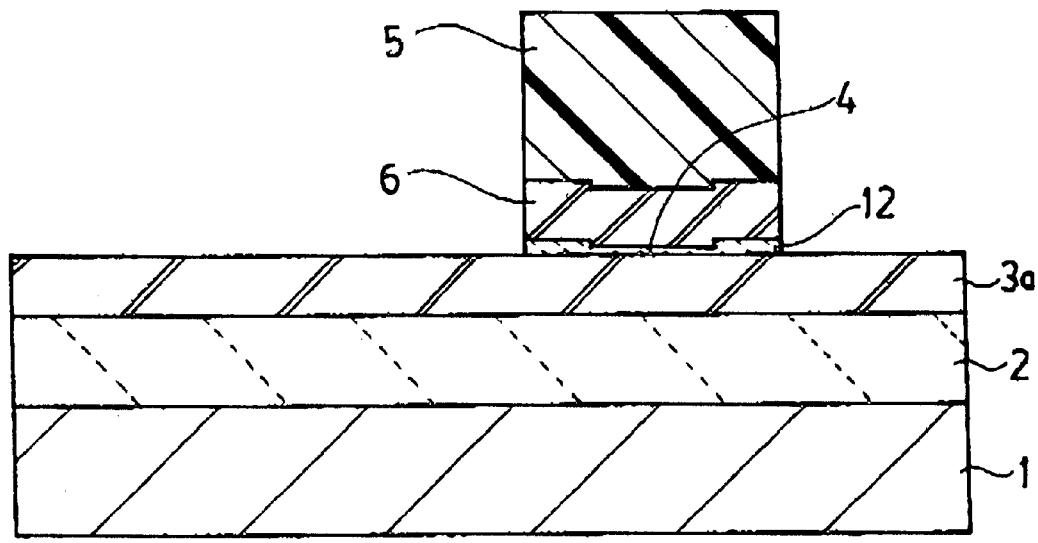

Dry etching using hydrogen bromide as etching gas is thereafter effected using the patterned photoresist 5 as an etching mask to pattern the second polycrystalline silicon film 3b into a memory gate electrode 6, as shown in FIG. 6. At this time, the mask oxide film 12 is patterned into the same shape as the memory gate electrode 6.

The semiconductor substrate 1 is then immersed in a hydrofluoric acid aqueous solution to remove bromide occurring as a reaction product of the hydrogen bromide. The photoresist 5 is then removed.

The memory gate electrode 6 here is formed on the memory oxide film 4 to a prescribed size larger than the memory oxide film 4 region so as to extend onto the mask oxide film 12.

The mask oxide film 12 under the memory gate electrode 6 is required to have thickness more than the thickness of the memory oxide film 4 between the edge of the memory oxide film 4 and the edge of the memory gate electrode 6.

Next, the surface of the semiconductor substrate 1 is spin-coated throughout with photoresist. The photoresist is exposed using a prescribed photomask and developed to pattern the photoresist 5 in the shape of a gate electrode, as shown in FIG. 7.

Figure 7:
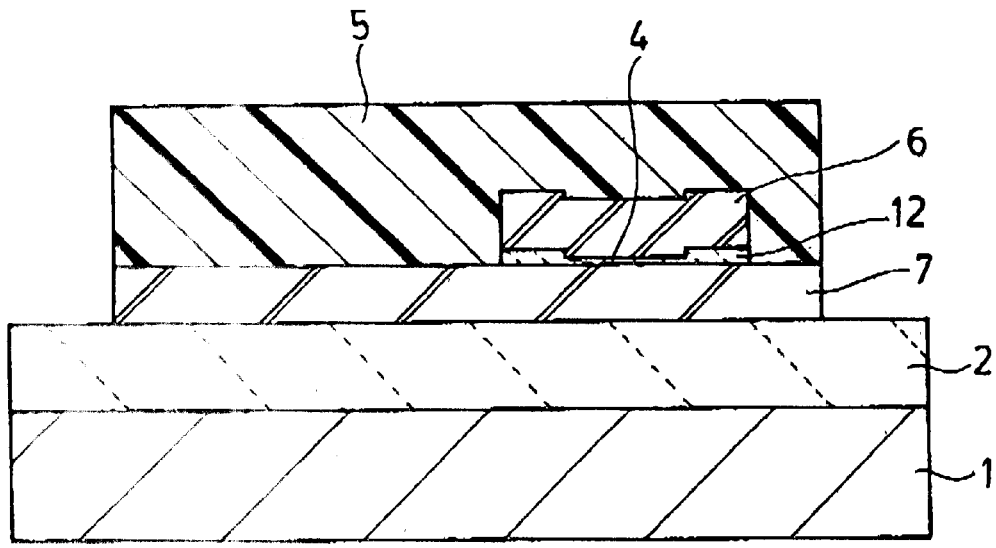

Isotropic etching using hydrogen bromide as etching gas is thereafter effected using the patterned photoresist 5 as an etching mask to pattern the first polycrystalline silicon film 3a as a gate electrode 7, as shown in FIG. 7.

The semiconductor substrate 1 is then immersed in a hydrofluoric acid aqueous solution to remove bromide occurring as a reaction product of the hydrogen bromide. The photoresist 5 is then removed.

Figure 8:
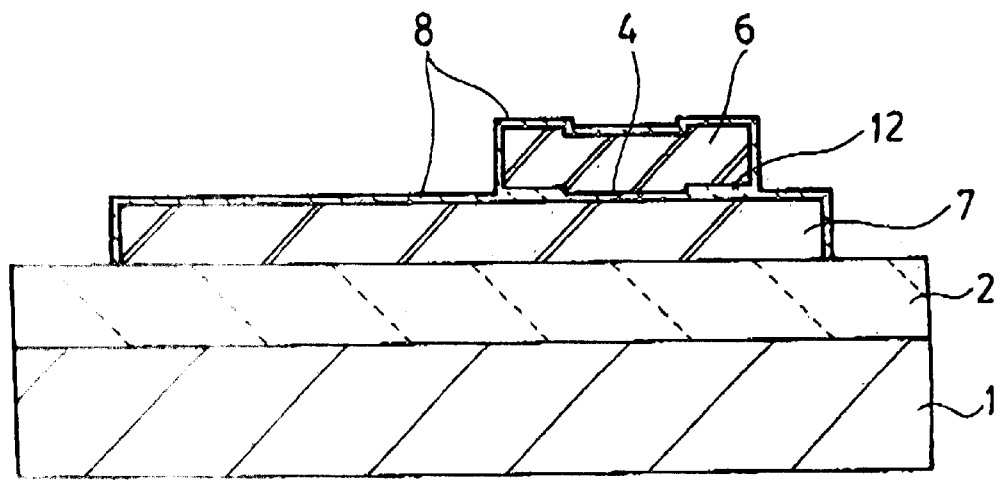
Figure 9:
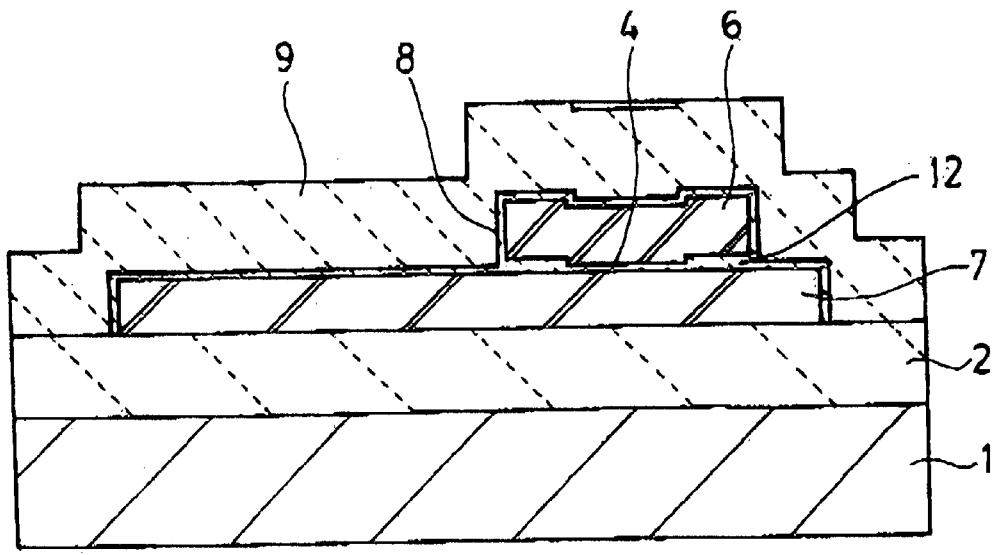

Annealing is thereafter effected in an oxygen atmosphere at 900° C. using an oxidation diffusion furnace to form a memory mask oxide film 8 to a thickness of 10 nm on the surfaces of the memory gate electrode 6 and the gate electrode 7, as shown in FIG. 8.

This memory mask oxide film 8 serves to prevent an interlevel insulator 9 formed in a later step and containing phosphorus or boron as impurity from contacting the memory gate electrode 6 and the gate electrode 7.

Although the periphery of the mask oxide film 12 is etched somewhat during the treatment with the hydrofluoric acid aqueous solution after formation of the memory gate electrode 6, the memory mask oxide film 8 is formed also at almost all of the etched portion by the formation of the memory mask oxide film 8.

Following this, a silicon oxide film-type interlevel insulator 9 is formed over the whole surface to a thickness of 500 nm by the CVD process using monosilane (SiH$_4$), diborane (B$_2$H$_6$) and phosphine (PH$_3$) as reactive gases so as to cover the memory mask oxide film.

The surface of the interlevel insulator 9 is spin-coated throughout with photoresist. The photoresist is exposed using a prescribed photomask and developed to pattern the photoresist 5 to form openings therein at portions where contact holes are to be formed, as shown in FIG. 10.

Figure 10:
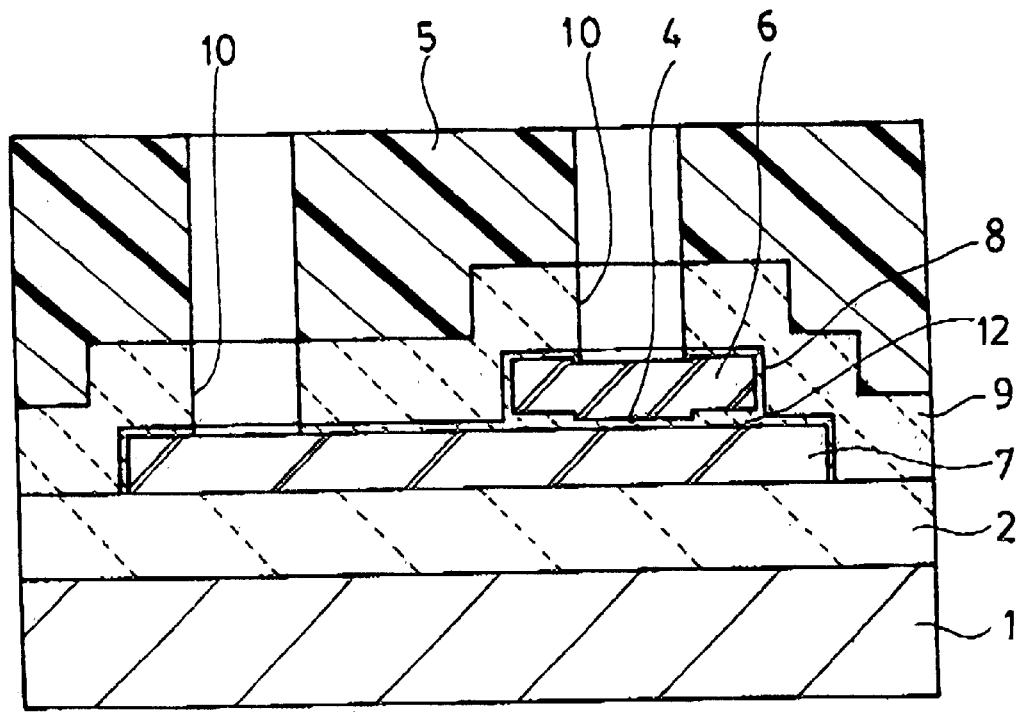

Isotropic etching is then effected using difluoromethane (CH$_2$F$_2$) and trifluoromethane (CHF$_3$) as etching gases to pattern the interlevel insulator 9 at prescribed points, thereby forming the contact holes 10 shown in FIG. 10, and the photoresist 5 is then removed.

Then, as shown in FIG. 11, metallic interconnections 11 composed of aluminum are formed through the contact holes 10 to establish electrical continuity with the memory gate electrode 6 and the gate electrode 7, thereby completing the N-type inter-gate insulating film breakdown type memory.

Second fabrication method: FIGS. 13 to 20, 8 to 11, 21 and 22

A method of fabricating the semiconductor nonvolatile storage that is a second embodiment of the invention method will now be explained with reference to, among others, the sectional views of FIGS. 13 to 20.

FIGS. 13 to 20 are schematic sectional views for showing in order the steps of a second embodiment of the method of fabricating the N-type inter-gate insulating film breakdown type memory differing from those of the first embodiment. Moreover, since the steps of FIGS. 8 to 11 used in the explanation of the first embodiment and the steps of FIGS. 21 and 22 used in the explanation of the prior art also apply in this second embodiment, they will be referred to again.

Also in this second embodiment, as shown in FIG. 21, a field oxide film 2 is first formed on the surface of a semiconductor substrate 1 of N-type conductivity to a thickness of 550 nm in a 1000° C. oxygen atmosphere using an oxidation diffusion furnace.

Next, as shown in FIG. 22, the whole surface of the field oxide film 2 is formed with a first polycrystalline silicon film 3a to a thickness of 350 nm by the CVD process using monosilane (SiH$_4$) as reaction gas.

The surface of the first polycrystalline silicon film 3a is then added throughout with phosphorus, an impurity of N-type conductivity, by the ion implantation method under condition of an ion implantation dose of about $10^{16}$ atoms/cm$^2$, thereby forming a first polycrystalline silicon film 3a added with N-type impurity.

Figure 13:
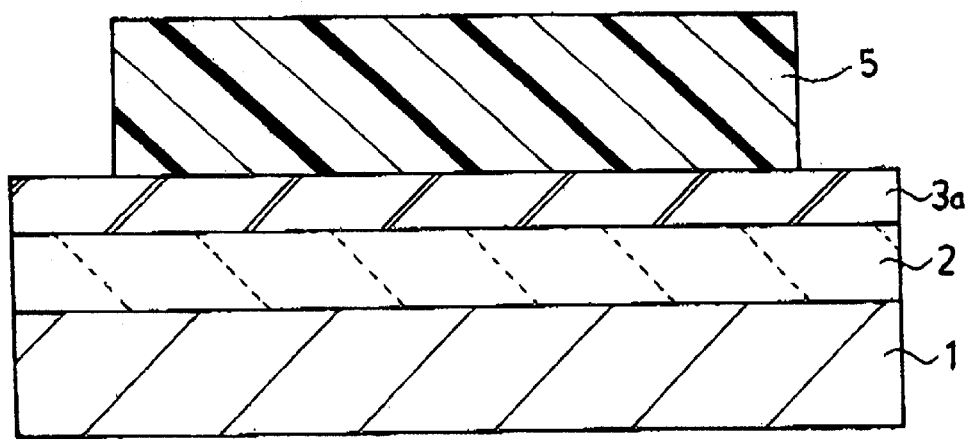
FIGS. 13 to 20 are schematic sectional views for explaining a second embodiment of the method of fabricating a semiconductor nonvolatile storage according to the invention, wherein only the steps differing from those of the first embodiment are illustrated in order.

The surface of the first polycrystalline silicon film 3a is thereafter spin-coated throughout with photoresist. The photoresist is exposed using a prescribed photomask and developed to pattern the photoresist 5 in the shape of a gate electrode, as shown in FIG. 13.

Figure 14:
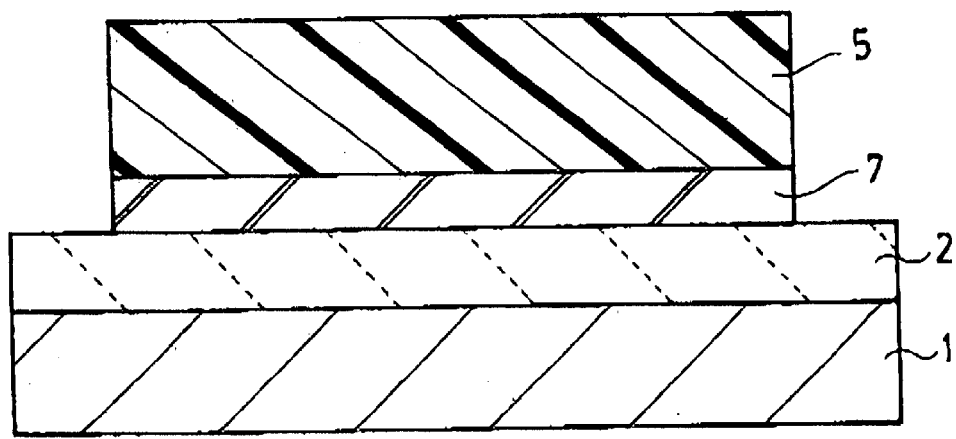

Isotropic etching using hydrogen bromide as etching gas is then effected using the patterned photoresist 5 as an etching mask to pattern the first polycrystalline silicon film 3a as a gate electrode 7, shown in FIG. 14.

The semiconductor substrate 1 is thereafter immersed in a hydrofluoric acid aqueous solution to remove bromide occurring as a reaction product of the hydrogen bromide. The photoresist 5 is then removed.

Figure 15:
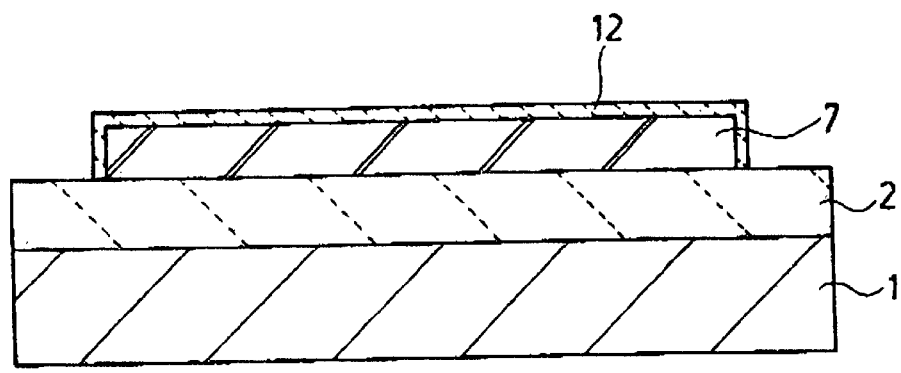

Then, annealing is effected in an oxygen atmosphere at 900° C. using an oxidation diffusion furnace to form a mask oxide film 12 on the surface of the first polycrystalline silicon film 3a (gate electrode 7) to a thickness of 10 nm, as shown in FIG. 15.

Figure 16:
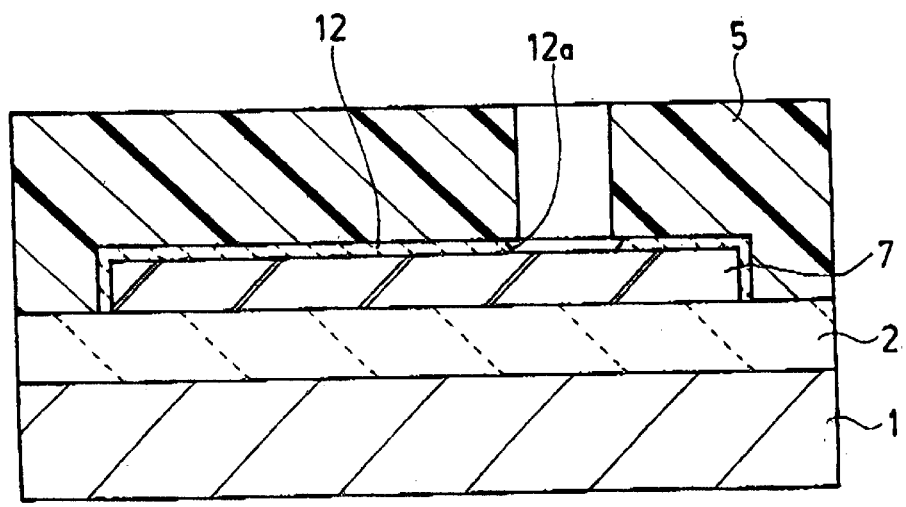

Next, the surfaces of the mask oxide film 12 and the exposed portion of the field oxide film 2 are spin-coated throughout with photoresist. The photoresist is exposed using a prescribed photomask and developed to pattern the photoresist 5 to form an opening therein at a region to be formed with a memory oxide film, as shown in FIG. 16.

The semiconductor substrate 1 is thereafter immersed in a hydrofluoric acid aqueous solution to form an opening 12a by removing the mask oxide film 12 present at the region to be formed with the memory oxide film, using the patterned photoresist 5 as an etching mask. The photoresist 5 is then removed.

Figure 17:
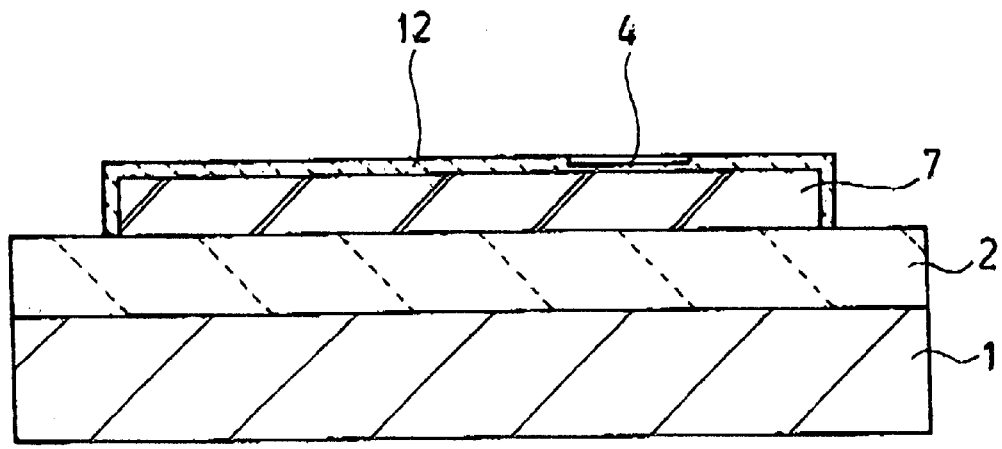

Next, annealing is effected in an oxygen atmosphere at 900° C. using an oxidation diffusion furnace to form a memory oxide film 4 of 3 nm thickness on the surface of the first polycrystalline silicon film 3a (gate electrode 7) exposed at the opening 12a of the mask oxide film 12, as shown in FIG. 17.

Figure 18:
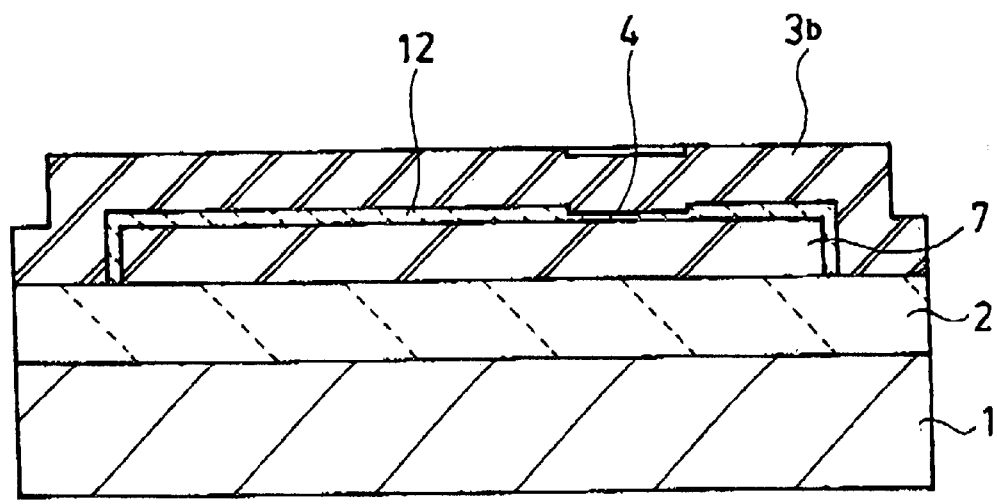

Thereafter, as shown in FIG. 18, the whole surface is formed with a second polycrystalline silicon film 3b of 350 nm thickness by the CVD process using monosilane ($SiH_4$) as reaction gas.

The surface of the second polycrystalline silicon film 3b is then added throughout with phosphorus, an impurity of N-type conductivity, by the ion implantation method under condition of an ion implantation dose of about $10^{16}$ atoms/$cm^2$, thereby forming a second polycrystalline silicon film 3b added with N-type impurity.

Figure 19:
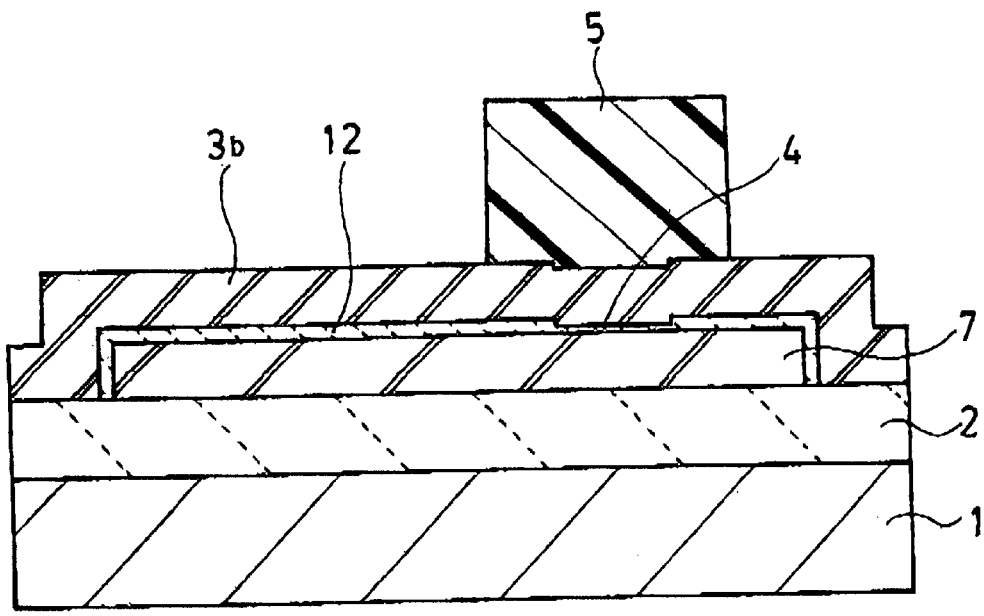

Next, the surface of the second polycrystalline silicon film 3b is spin-coated throughout with photoresist. The photoresist is exposed using a prescribed photomask and developed to pattern the photoresist 5 in the shape of a memory gate electrode, as shown in FIG. 19.

Figure 20:
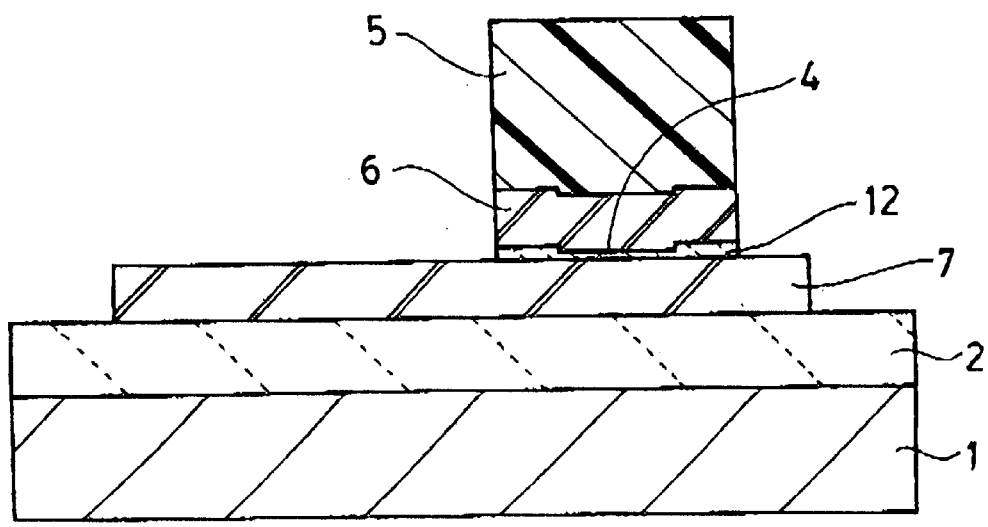

Dry etching using hydrogen bromide as etching gas is thereafter effected using the patterned photosensitive resin 5 as an etching mask to pattern the second polycrystalline silicon film 3b into a memory gate electrode 6, as shown in FIG. 20. At this time, the mask oxide film 12 is patterned into the same shape as the memory gate electrode 6.

The semiconductor substrate 1 is then immersed in a hydrofluoric acid aqueous solution to remove bromide occurring as a reaction product of the hydrogen bromide. The photoresist 5 is then removed.

The memory gate electrode 6 here is formed on the memory oxide film 4 to a prescribed size larger than the memory oxide film 4 region so as to extend onto the surrounding mask oxide film 12. The mask oxide film 12 under the memory gate electrode 6 is required to have thickness more than the thickness of the memory oxide film 4 between the edge of the memory oxide film 4 and the edge of the memory gate electrode 6.

Since the subsequent steps are the same as the steps in the case of the first embodiment explained with reference to FIGS. 8 to 11, their explanation is omitted.

Although in this embodiment, too, the periphery of the mask oxide film 12 is etched somewhat during the treatment with the hydrofluoric acid aqueous solution after the memory gate electrode 6 has been formed as shown in FIG. 20, the memory mask oxide film 8 shown in FIG. 8 is also formed at almost all of the etched portion by the formation of the memory mask oxide film 8.

By the N-type inter-gate insulating film breakdown type memory fabricated according to either of the first and second embodiments, the characteristic of change in current flow between the gate electrode 7 and the memory gate electrode 6 with voltage applied to the memory gate electrode 6 shown in FIG. 12 is obtained and the leak current produced by the voltage applied to the memory gate electrode is greatly ameliorated to a level allowable from the aspect of reliability.

Depending on the application, the steps of forming the memory mask oxide film and the interlevel insulator can be omitted.

Although embodiments of the fabricating method were explained for the case of a semiconductor nonvolatile storage structured as an N-type inter-gate insulating film breakdown type memory, the fabrication steps are similar to those of the foregoing embodiments also in the case of fabricating a P-type inter-gate insulating film breakdown type memory to which writing is effected by breaking down a mask oxide film provided between a gate electrode of P-type conductivity and a memory gate electrode of P-type conductivity.

In this case, however, a P-type impurity such as boron is ion-implanted into the first and second polycrystalline silicon films 3a, 3b to form first and second polycrystalline silicon films 3a, 3b added with P-type impurity.

A silicon substrate of either N-type or P-type conductivity can be used.

As explained in the foregoing, in the semiconductor nonvolatile storage according to this invention and in the semiconductor nonvolatile storage fabricated by the method of this invention, even when, during formation of the memory gate electrode, dry etching is effected using hydrogen bromide as etching gas and treatment with a hydrofluoric acid aqueous solution is thereafter effected to remove bromide that occurs as a reaction product of the etching and remains on the wafer surface, the memory oxide film 4 is not exposed and etched laterally because the memory oxide film has the mask oxide film 12 of thicker thickness formed thereabout.

Therefore, when voltage is applied to the memory gate electrode, no unnecessary current flows between the gate electrode and the memory gate electrode, thereby ensuring constant normal operation as a semiconductor nonvolatile storage.

What is claimed is:

1. A semiconductor nonvolatile storage comprising:
    a field oxide film provided on a semiconductor substrate,
    a gate electrode comprising a polycrystalline silicon film provided on the field oxide film,
    a mask oxide film formed by oxidizing a surface of the gate electrode,
    a memory oxide film formed by oxidizing a surface of the gate electrode in an opening formed in the mask oxide film, and
    a memory gate electrode provided to extend from over the memory oxide film to over the mask oxide film,
    a thickness of the memory oxide film being made thinner than a thickness of the mask oxide film.

2. The semiconductor nonvolatile storage according to claim 1 which further comprising:
    a memory mask oxide film is provided on surfaces of the memory gate electrode and the gate electrode, and
    an interlevel insulator of doped silicon oxide film type is provided to cover the memory mask oxide film.

* * * * *